United States Patent [19]

Billings et al.

[11] Patent Number: 4,835,652
[45] Date of Patent: May 30, 1989

[54] BI-DIRECTIONAL DC POWER CONTROLLER WITH FAULT PROTECTION

[75] Inventors: William W. Billings, American Township, Allen County; David A. Fox, Shawnee Township, Allen County, both of Ohio

[73] Assignee: Westinghouse Electric Corp., Pittsburgh, Pa.

[21] Appl. No.: 215,690

[22] Filed: Jul. 6, 1988

[51] Int. Cl.[4] .............................................. H02H 3/28
[52] U.S. Cl. ........................................ 361/79; 361/86; 361/87; 361/91; 361/101; 363/63
[58] Field of Search ......................... 361/30, 31, 33, 78, 361/79, 86, 87, 88, 90, 91, 93, 98, 100, 101; 363/16, 63; 320/14, 19, 61; 323/223, 224

[56] References Cited

U.S. PATENT DOCUMENTS

| 3,697,813 | 10/1972 | Fox | 361/98 |
| 3,710,231 | 1/1973 | Baker | 323/290 |
| 3,879,652 | 4/1975 | Billings | 361/100 |
| 3,925,709 | 12/1975 | Mitchell et al. | 361/100 |
| 4,110,809 | 8/1978 | Cronin | 361/95 |
| 4,150,413 | 4/1979 | Nerem | 361/86 |
| 4,160,282 | 7/1979 | Dolinar et al. | 361/79 X |
| 4,241,372 | 12/1980 | Sears | 361/93 |
| 4,245,184 | 1/1981 | Billings et al. | 323/235 |
| 4,346,424 | 8/1982 | Hansen | 361/94 |
| 4,350,956 | 9/1982 | DePuy | 361/88 X |
| 4,363,064 | 12/1982 | Billings et al. | 361/57 |
| 4,404,473 | 9/1983 | Fox | 307/125 |
| 4,420,787 | 12/1983 | Tibbits et al. | 361/79 |
| 4,473,856 | 9/1984 | Takahashi et al. | 361/87 X |
| 4,553,187 | 11/1985 | Burns et al. | 361/96 |
| 4,626,954 | 12/1986 | Damiano et al. | 361/96 |
| 4,656,554 | 4/1987 | Maschek et al. | 361/56 |
| 4,709,160 | 11/1987 | Kinoshita | 307/253 |

Primary Examiner—A. D. Pellinen
Assistant Examiner—H. L. Williams
Attorney, Agent, or Firm—R. P. Lenart

[57] ABSTRACT

A bi-directional DC power controller is provided with a bi-directional DC switch connected between a pair of terminals for connection to a pair of line power conductors. A first difference amplifier is connected to receive voltages at these terminals and to produce an output voltage signal which is proportional to the difference in voltages between these terminals when the voltage at one of the terminals is greater than the voltage at the other terminal, and is constant when the voltage at the second terminal is greater than the voltage at the first terminal. A second differential amplifier also receives voltage signals from these terminals and produces an output voltage signal which is proportional to the difference in voltages between the terminals when the voltage at the second terminal is greater than the voltage at the first terminal, and which is constant when the voltage at the first terminal is greater than the voltage at the second terminal. The outputs of the difference amplifiers are combined to produce a control voltage signal having a magnitude that is proportional to the absolute value of the difference between voltages at the terminals. This control signal is used to control the operation of the bi-directional DC switch.

6 Claims, 1 Drawing Sheet

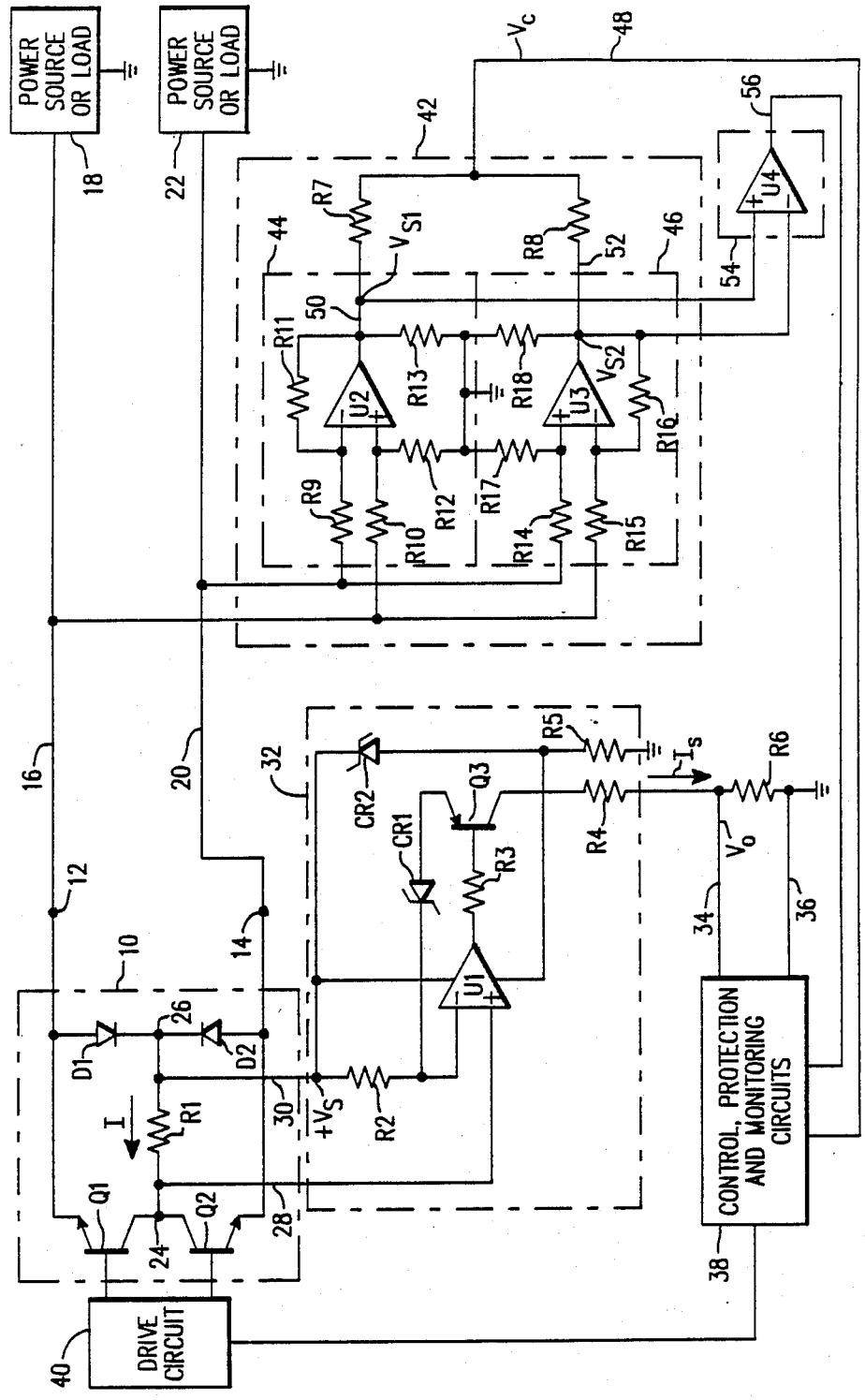

BI-DIRECTIONAL DC POWER CONTROLLER WITH FAULT PROTECTION

BACKGROUND OF THE INVENTION

This invention relates to DC power controllers and, more particularly, to bi-directional DC power controllers which include fault detection and protection circuits.

High voltage DC power distribution systems are being developed for use in aircraft and space applications. These power systems present challenging requirements for solid state power controllers that will be used for controlling and protecting loads and load busses beyond those provided by present state of the art switchgear, either solid state or electromechanical. Such power controllers must provide for bi-directional direct current flow while maintaining low switch voltage drop and low power dissipation. Control and protection features must be included along with the capability to control and limit current.

SUMMARY OF THE INVENTION

This invention provides a power controller which meets the above requirements for use in high voltage DC electric power systems and includes unique fault protection circuitry which easily interfaces high voltage DC line power with low voltage control circuits.

Bi-directional DC power controllers constructed in accordance with this invention comprise a bi-directional DC power switch connected between a pair of terminals which are used to connect the controller to the DC power system. A pair of differential amplifiers are connected to monitor the voltages at these terminals. One of the amplifiers produces an output signal proportional to the difference in terminal voltages when the voltage at a first one of the terminals exceeds the voltage at the second terminal, and is a low value when the voltage at the second terminal is greater than the voltage at the first terminal. The other differential amplifier produces an output signal which is proportional to the difference in voltages between the terminals when the voltage at the second terminal exceeds the voltage at the first terminal, and is a low value when the voltage at the first terminal exceeds the voltage at the second terminal. The differential amplifier output signals are combined to produce a control signal having a magnitude proportional to the absolute value of the difference between the terminal voltages. This control signal is used by a control circuit in the power controller to control the operation of the bi-directional DC switch.

The differential amlifier circuits provide unique intrinsic voltage stand-off capability that permits simple signal transmission across high-voltage potentials. These amplifiers also provide output signals which can be easily combined to derive a switch voltage polarity signal.

Current sensing is provided by a shunt strategically placed within the power switch to provide a voltage signal proportional to current flowing within the switch. This voltage signal is fed to a voltage controlled current source which includes a high voltage interface and supplies a current to a fixed resistor thereby producing an additional control signal which is proportional to current flowing in the bi-directional DC switch.

BRIEF DESCRIPTION OF THE DRAWING

The single FIGURE is a schematic diagram of a bi-directional DC power controller constructed in accordance with the preferred embodiment of this invention.

DESCRIPTION OF THE PREFERRED EMBODIMENT

Referring to the drawing, the preferred embodiment of this invention includes a bi-directional DC switch 10 electrically connected between a pair of terminals 12 and 14. Terminal 12 is connected to a first line power conductor 16 which receives relatively high voltage DC, for example, 150 to 200 volts DC, from a line power source 18. Terminal 14 is connected to a second line power conductor 20 which delivers line power to a load 22 when switch 10 is turned on. At unpredictable times, the roles of power source 18 and load 22 may be reversed. For example, if source 18 is a battery, it will act as a load during recharging.

The bi-directional DC power switch 10 includes a pair of transistors Q1 and Q2 each having a main conduction path and a control, or base, electrode. The main conduction paths of transistors Q1 and Q2 are electrically connected in series with each other in a first circuit branch having a first junction point 24 located between the transistors. A second branch circuit includes the reverse series connection of a pair of diodes D1 and D2 with a second junction point 26 located between these diodes. A resistive shunt R1 extends between the junction points such that current flowing through the switch 10 produces a current indicating DC voltage signal across the shunt R1 on lines 28 and 30. This current indicating voltage signal is fed to a voltage controlled current source 32 which comprises operational amplifier U1, resistors R2, R3, R4 and R5, zener diodes CR1 and CR2, and transistor Q3. Constant current circuit 32 is powered by the line power source (connected to either terminal 12 or 14), with its operating voltage being regulated by zener diode CR2 such that it generates a constant current independently of source voltage variations with the constant current being proportional to the voltage developed across shunt R1. This constant current is fed to a load resistor R6 to produce a voltage signal on lines 34 and 36 which is proportional to the current flowing in the bi-directional DC switch. Control, protection and monitoring circuits 38, which may be constructed in accordance with known techniques, receive this voltage signal and control the operation of the bi-directional DC power switch in accordance with it, through drive circuit 40. Resistors R4 and R5 serve as a high voltage interface between voltage controlled current source 32 and the low voltage control protection and monitoring circuits 38. A strategic location of resistive shunt R1 effectively rectifies the bi-directional direct load currents, such that the current indication voltage signal on lines 28 and 30 is a DC voltage that is proportional to load current flowing in either direction. The location of the resistive shunt also permits the voltage controlled current source to be powered from the line power supply, thereby eliminating the need for an isolated power supply for powering the current sensing control circuit.

Current source 32 develops an output current $I_S$ from the collector of transistor Q3 to ground, which is very nearly equal to the current indicating voltage signal $V_S$ divided by R2, that is, $I_S = V_S/R2 = (R1 \times I)/R2$, where I is the load current flowing through switch 10. This output current $I_S$ is used to develop a sensing voltage $V_O$ at ground level potential across resistor R6 that will be equal to: $V_O = R6 \times (I_S) = (R1 \times I) \times (R6/R2) = KI$, where K is a constant. Voltage $V_O$ is used for control, protection and monitoring at ground level potential.

A voltage sensing circuit 42 includes a pair of difference amplifiers 44 and 46 that produce output signals which are OR'd by resistors R7 and R8 to produce a control signal on line 48 that has a magnitude which is proportional to the absolute value of the difference in voltages between terminals 12 and 14. Differential amplifier 44 includes operational amplifier U2 and resistors R9, R10, R11, R12 and R13 connected as illustrated in the FIGURE. One end of the resistor R9 serves as a first input to this difference amplifier and is electrically connected to terminal 4 and one end of resistor R10 serves as a second input to the amplifier and is connected to terminal 12. The difference amplifier components are connected such that the amplifier produces an output voltage signal on line 50 which proportional to the difference in voltages between terminals 12 and 14 when the voltage at terminal 12 is greater than the voltage at terminal 14, and which is constant (zero) when the voltage at terminal 14 is greater than the voltage at terminal 12.

Difference amplifier 46 includes operational amplifier U3 and resistors R14, R15, R16, R17 and R18. One end of resistor R14 serves as a first input to difference amplifier 46 and is electrically connected to terminal 14. One end of resistor R15 serves as a second input to amplifier 46 and is electrically connected to terminal 12. The components of difference amplifier 46 are electrically connected such that an output voltage signal is produced on line 52 which is proportional to the difference in voltages between terminals 12 and 14 when the voltage at terminal 14 is greater than the voltage at terminal 12, and is constant (zero) when the voltage at terminal 12 is greater than the voltage at terminal 16. The voltage signals on terminals 50 and 52 are OR'd by resistors R7 and R8 to produce a control signal on line 48 which is proportional to the absolute value of the difference in voltages between terminals 12 and 14.

A polarity indicator circuit 54 includes a comparator U4 having inputs for receiving the voltage signals on lines 50 and 52 to produce a polarity indicating logic signal on line 56. Both the control signal on line 48 and the polarity indicating signal on line 56 are fed to the prior art control, protection and monitoring circuits 38 for use in controlling the operation of switch 10.

In one embodiment of this invention, wherein resistors R9, R10, R14 and R15 have identical values; resistors R7, R8, R11, R12, R16 and R17 have identical values; and resistors R13 and R18 have identical values, the voltage signal $V_{S1}$ on line 50 is equal to: $V_{S1} = (R11/R9) \times (V_{12} - V_{14})$, for $V_{12} > V_{14}$, where $V_{12}$ is the voltage at terminal 12 and $V_{14}$ is the voltage at terminal 14. For $V_{12} \leq V_{14}$, $V_{S1} = 0$. Similarly, the voltage on line 52, $V_{S2}$, is equal to: $V_{S2} = (R16/R14) \times (V_{14} - V_{12})$ for $V_{14} > V_{12}$ and $V_{S2} = 0$ for $V_{14} \leq V_{12}$. This results in a control voltage $V_C$ on line 48 being equal to a constant times the absolute value of $V_{12} - V_{14}$. The resistors R9, R10, R14 and R15 serve as a high voltage interface between the high voltages on lines 16 and 20 and the low voltage control circuits 38.

It can therefore be seen that the present invention provides a bi-directional DC power controller having unique fault protection circuits. These circuits include single point sensing of bi-directional currents and voltages and interfacing of sensed signals across high voltage potentials. The voltage sensing circuit provides effective power switch voltage sensing proportional to the absolute value of the switch voltage. A simple means of switch voltage polarity is provided by utilizing the voltages developed at the outputs of the difference amplifier circuits. The translation of sensed voltages from high voltage levels to low voltage control circuit levels is achieved by using high voltage interface resistors. The current sensing circuit offers single point detection of bi-directional power switch currents and utilizes a voltage controlled current source to provide an effective means of translating the bi-directional current sensing voltage from high levels to ground level potential.

Although the present invention has been described in terms of what is at present believed to be its preferred embodiment, it will be apparent to those skilled in the art that various changes may be made without departing from the scope of the invention. It is therefore intended that the appended claims cover such changes.

What is claimed is:
1. A bi-directional DC power controller comprising:
   a bi-directional DC switch electrically connected between a first terminal, for connection to a first line power conductor, and a second terminal, for connection for connection to a second line power conductor;
   a control circuit for controlling the operation of said switch in accordance with a control signal;
   a first difference amplifier having a positive input connected to said first terminal, a negative input connected to said second terminal, and an output, said first difference amplifier producing a first output voltage signal which is proportional to the difference in voltages between said first and second terminals when the voltage at said first terminal is greater than the voltage at said second terminal, and which is a constant when the voltage at said second terminal is greater than the voltage at said first terminal;
   a second difference amplifier having a positive input connected to said second terminal, a negative input connected to said first terminal, and an output, said second difference amplifier producing a second output voltage signal which is proportional to the difference in voltages between said first and second terminals when the voltage at said second terminal is greater than the voltage at said first terminal and which is a constant when the voltage at said first terminal is greater than the voltage at said second terminal; and
   means for combining said first and second output voltage signals from said difference amplifiers to produce said control signal having a magnitude proportional to the absolute value of the difference between voltages at said first and second terminals.

2. A bi-directional DC power controller as recited in claim 1, wherein each of said difference amplifiers comprises:
   an operational amplifier having a positive input, a negative input and an output;
   a first resistor electrically connected between a first one of said terminals and the positive input of said operational amplifier;

a second resistor electrically connected between a second one of said terminals and the negative input of said operational amplifier;

a third resistor electrically connected between the output of said operational amplifier and one of said inputs of said operational amplifier;

a fourth resistor electrically connected between the positive input of said operational amplifier and ground; and a fifth resistor electrically connected between the output of said operational amplifier and ground.

3. A bi-directional DC power controller as recited in claim 1, further comprising:

a comparator having inputs for receiving the output voltage signals of said first and second difference amplifiers and producing a polarity indication logic signal in response to the relative polarities of voltages at said first and second terminals.

4. A bi-directional DC power controller as recited in claim 1, wherein said bi-directional DC switch comprises:

first and second transistors, each having a main conduction path and a control electrode, said main conduction paths being electrically connected in series with each other in a first circuit branch having a first junction point located between said transistors;

a first pair of diodes being electrically reverse series connected in a second branch circuit having a second junction point located between said diodes;

said first and second circuit branches being electrically connected in parallel with each other between said first and second terminals; and a resistive shunt electrically connected between said first and second junction points.

5. A bi-directional DC power controller as recited in claim 4, further comprising:

a voltage controlled current source connected to receive a current indicating voltage signal produced across said resistive shunt by current flowing in said bi-directional DC switch, said current source producing an output current proportional to said current indicating voltage signal; and a load resistor connected to receive said output current from said current source, such that a third voltage signal, proportional to said current flowing in said bi-directional DC switch, is produced across said load resistor.

6. A bi-directional DC power controller as recited in claim 5, wherein:

said voltage controlled current source receives power from a connection to one end of said resistive shunt; and said voltage controlled current source further includes a voltage regulating device electrically connected between said one end of said resistive shunt and ground.

* * * * *